(12) United States Patent
Kim et al.

(10) Patent No.: US 10,236,794 B2
(45) Date of Patent: Mar. 19, 2019

(54) HYBRID POWER GENERATING DEVICE

(71) Applicant: RESEARCH & BUSINESS FOUNDATION SUNGKYUNKWAN UNIVERSITY, Suwon-si (KR)

(72) Inventors: Sangwoo Kim, Yongin-si (KR); Keun Young Lee, Suwon-si (KR); Ju-hyuck Lee, Cheonan-si (KR); Suhyun Yoon, Anyang-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 1086 days.

(21) Appl. No.: 14/592,190

(22) Filed: Jan. 8, 2015

(65) Prior Publication Data

US 2015/0194910 A1 Jul. 9, 2015

(30) Foreign Application Priority Data

Jan. 9, 2014 (KR) .................. 10-2014-0003064

(51) Int. Cl.
| | |
|---|---|
| *H02N 1/04* | (2006.01) |
| *H02N 2/18* | (2006.01) |
| *H02N 2/00* | (2006.01) |
| *H01L 41/113* | (2006.01) |
| *H01L 41/18* | (2006.01) |

(52) U.S. Cl.
CPC ............ *H02N 1/04* (2013.01); *H01L 41/113* (2013.01); *H01L 41/183* (2013.01); *H02N 2/00* (2013.01); *H02N 2/18* (2013.01); *H02N 2/186* (2013.01); *H02N 2/22* (2013.01)

(58) Field of Classification Search
CPC .. H02N 1/04; H02N 1/12; H02N 1/00; H02N 2/00; H02N 2/0065; H02N 2/18; H02N 2/186; H02N 2/22; H01L 41/113; H01L 41/183
USPC ....... 310/309, 308, 339, 313 A, 323.06, 327, 310/342, 367
See application file for complete search history.

(56) References Cited

U.S. PATENT DOCUMENTS

| | | | |
|---|---|---|---|
| 2004/0178701 A1* | 9/2004 | Sato | H01L 41/0833 310/328 |
| 2010/0071179 A1* | 3/2010 | Koizumi | C01G 23/003 29/25.35 |
| 2010/0253184 A1* | 10/2010 | Choi | H02N 2/18 310/339 |

(Continued)

FOREIGN PATENT DOCUMENTS

| | | |
|---|---|---|
| JP | 2011-172367 A | 9/2011 |
| KR | 10-2012-0027468 A | 3/2012 |

(Continued)

*Primary Examiner* — Thomas Truong
*Assistant Examiner* — Alexander Singh
(74) *Attorney, Agent, or Firm* — NSIP Law

(57) ABSTRACT

A hybrid power generating device can include: a first substrate; a lower electrode layer disposed on the first substrate; a piezoelectric layer disposed on the lower electrode layer, and formed of a complex in which an inorganic piezoelectric material and an organic polymer matrix are mixed; a spacer disposed on the piezoelectric layer; an upper electrode layer disposed on the spacer and configured to rub against the piezoelectric layer so as to be charged along with the piezoelectric layer; and a second substrate disposed on the upper electrode layer.

10 Claims, 2 Drawing Sheets

(56) References Cited

U.S. PATENT DOCUMENTS

2011/0217519 A1* 9/2011 Sakashita ................. B32B 9/00
                                                        428/172
2015/0001993 A1* 1/2015 Park ...................... H01L 41/113
                                                        310/319

FOREIGN PATENT DOCUMENTS

KR    10-2013-0060998 A    6/2013
KR       10-1338392 B1    12/2013

\* cited by examiner

[Fig 1]
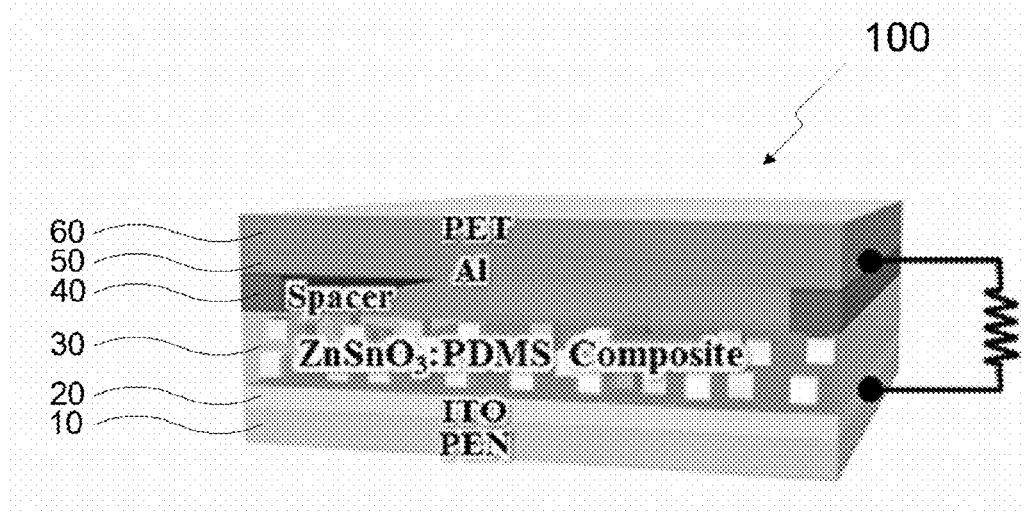

[Fig 2]
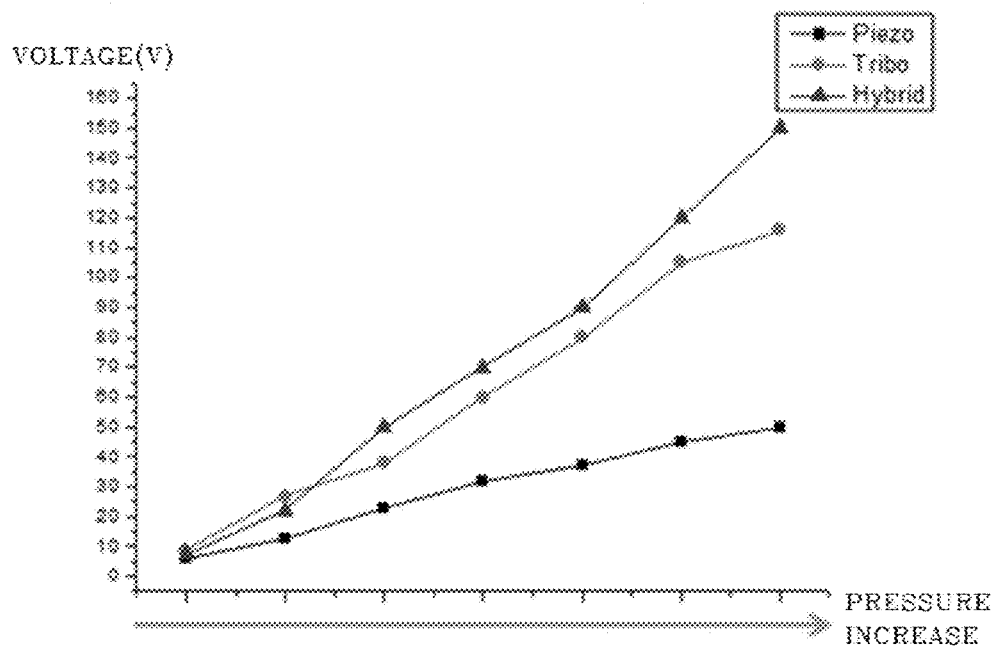
[Fig 3]
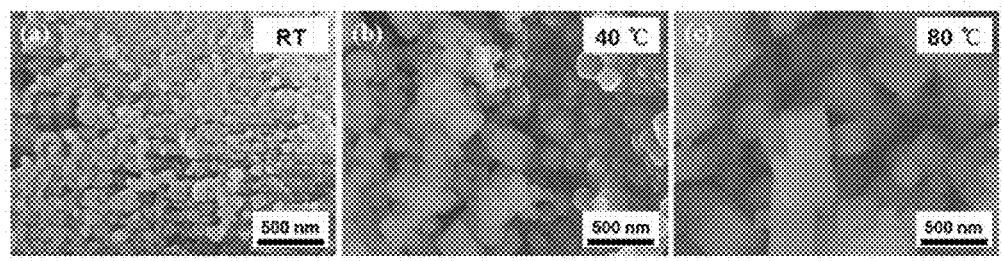

HYBRID POWER GENERATING DEVICE

CROSS-REFERENCE TO RELATED APPLICATION

This application claims the benefit under 35 USC 119(a) of Korean Patent Application No. 10-2014-0003064, filed on Jan. 9, 2014, the entire disclosure of which is incorporated herein by reference for all purposes.

BACKGROUND

1. Field of the Invention

The present invention relates to a device capable of generating an electric energy using a pressure and static electricity. More specifically, the present invention relates to a hybrid power generating device including a piezoelectric generating device configured to generate an electric energy using a pressure and an electrostatic generating device configured to generate an electric energy using static electricity.

2. Discussion of Related Art

A limitless mechanical energy (i.e., wind, surf, a micro vibration, and/or the like) and a limitless solar energy exist around us. These energies are noticed as new generation green energies of the future.

A piezoelectric generating device which transforms the mechanical energy into an electric energy has been developed and used in an asphalt (in Israel), and has a high capability to be used as interior materials in a building. The piezoelectric generating device has high energy transformation efficiency, capability of being small-sized and light-weighted, and is appreciated as new technology which leads a remarkable technical leap in an eco-friendly energy related fields when converged with nano technology. According to the above trend, an interest in the piezoelectric generating device is being increased.

However, when a pressure applied to the piezoelectric generating device is small, there is a problem that the generated electric energy is small. Also, the piezoelectric generating device has a limitation in that the electric energy is generated only when the device is bent or vibrated. In particular, when a high stress (pressure) is applied to the piezoelectric generating device in a perpendicular direction, a material forming the piezoelectric generating device or an interface between the material and the electrode is broken, and thus, there are problems in mechanical stability and reliability of the piezoelectric generating device.

Thus, the inventor of the present invention applies a power generating device using static electricity into the piezoelectric generating device, and thus, develops a new hybrid power generating device which is capable of generating a great electric energy although the applied pressure is small and increasing mechanical stability and reliability.

PRIOR ART DOCUMENT

Korean Patent Laid Open Publication No. 10-2012-0027468.

SUMMARY

The present invention is directed to a hybrid power generating device including a piezoelectric generating device configured to generate an electric energy using a pressure and an electrostatic generating device configured to generate an electric energy using static electricity.

One aspect of the present invention provides a hybrid power generating device including: a first substrate; a lower electrode layer disposed on the first substrate; a piezoelectric layer disposed on the lower electrode layer, and formed of a complex in which an inorganic piezoelectric material and an organic polymer matrix are mixed; a spacer disposed on the piezoelectric layer; an upper electrode layer disposed on the spacer and configured to rub against the piezoelectric layer so as to be charged along with the piezoelectric layer; and a second substrate disposed on the upper electrode layer.

Another aspect of the present invention provides a hybrid power generating device including: a first substrate; a lower electrode layer disposed on the first substrate; a piezoelectric layer disposed on the lower electrode layer, and formed of a complex in which an inorganic piezoelectric material and an organic polymer matrix; a spacer disposed on the piezoelectric layer are mixed; a rubbing electrified body disposed on the spacer, and configured to rub against the piezoelectric layer so as to be charged with the piezoelectric layer; an upper electrode layer disposed on the rubbing electrified body; and a second substrate disposed on the upper electrode layer.

In one embodiment, the inorganic piezoelectric material may be randomly distributed in the organic polymer matrix, and the inorganic piezoelectric material may have a hexahedral shape.

In one embodiment, the lower electrode layer may include at least one selected from the group consisting of gold (Au), silver (Ag), copper (Cu), graphene, a carbon nanotube, and indium tin oxide (ITO).

In one embodiment, the inorganic piezoelectric material may include at least one selected from the group consisting of zinc tin oxide ($ZnSnO_3$), barium titanate ($BaTiO_3$), and bismuth ferrite ($BiFeO_3$).

In one embodiment, the organic polymer may include at least one selected from the group consisting of polydimethylsiloxane (PDMS) and polymethylmethacrylate (PMMA).

In one embodiment, the first substrate and the second substrate may include flexible substrates, and the hybrid power generating device may further include an auxiliary layer interposed between the lower electrode layer and the piezoelectric layer, and formed of a conductive material.

In one embodiment, the piezoelectric layer may include the inorganic piezoelectric material at a content of 35 to 45 wt %.

BRIEF DESCRIPTION OF THE DRAWINGS

The above and other features and advantages of the present invention will become more apparent to those of ordinary skill in the art by describing in detail exemplary embodiments thereof with reference to the attached drawings in which:

FIG. 1 is a conceptual view illustrating a hybrid power generating device according to an embodiment of the present invention;

FIG. 2 is a graph illustrating output voltages of the hybrid power generating device according to the embodiment of the present invention; and FIG. 3 shows images illustrating shapes of zinc-tin oxide particles formed based on a reaction temperature of zinc sulfate heptahydrate and sodium stannate.

DETAILED DESCRIPTION OF EMBODIMENTS

It is important to understand that the present invention may be embodied in many alternative forms and should not be construed as limited to the example embodiments set forth herein. While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

Hereinafter, best modes of the present invention will be explained in detail with reference to the accompanying drawings. In assigning reference numerals to the structural parts of each drawing, like numerals may refer to like elements throughout the description of the figures.

FIG. 1 is a conceptual view illustrating a hybrid power generating device according to an embodiment of the present invention.

Referring to FIG. 1, a hybrid power generating device 100 according to the embodiment of the present invention may include a first substrate 10, a lower electrode layer 20, a piezoelectric layer 30, a spacer 40, an upper electrode layer 50, and a second substrate 60.

Further, a hybrid power generating device 100 according to another embodiment of the present invention may include a first substrate 10, a lower electrode layer 20, a piezoelectric layer 30, a spacer 40, a rubbing electrified body, an upper electrode layer 50, and a second substrate 60.

The rubbing electrified body is formed of a material which is charged along with the piezoelectric layer 30 by being rubbed against the piezoelectric layer 30 and the upper electrode layer 50 may be substituted by the rubbing electrified body when the rubbing electrified body has conductivity and may serve as an electrode. However, when the rubbing electrified body does not have conductivity and may not serve as an electrode, the hybrid power generating device 100 may include a separate upper electrode layer 50.

Hereinafter, the present invention will be explained based on an embodiment in which the upper electrode layer 50 may rub against the piezoelectric layer 30 so as to be charged along with the piezoelectric layer 30 and have conductivity, and a case including the rubbing electrified body will be explained with additional explanation.

The first substrate 10 may be a flexible substrate, and may support the lower electrode layer 20 disposed on the first substrate 10. For example, polyethylene-naphthalate (PEN) may be used for the first substrate 10, but the first substrate 10 may not be limited thereto.

The lower electrode layer 20 may be disposed on the first substrate 10, and may be formed of a conductive material. The lower electrode layer 20 may include at least one selected from the group consisting of gold (Au), silver (Ag), copper (Cu), graphene, a carbon nanotube, and indium tin oxide (ITO).

The hybrid power generating device 100 according to the embodiment of the present invention may further include an auxiliary layer (not shown) interposed between the lower electrode layer 20 and the piezoelectric layer, combined with the lower electrode layer 20 and the piezoelectric layer 30, and formed of a conductive material. For example, chromium (Cr) having a conductive characteristic may be used for the auxiliary layer. By the above, the lower electrode layer 20 may be more easily attached to the piezoelectric layer 30.

The piezoelectric layer 30 may be disposed on the lower electrode layer, and may be formed of a complex in which an inorganic piezoelectric material and an organic polymer matrix are mixed.

The inorganic piezoelectric material may be randomly distributed in the organic polymer matrix. The inorganic piezoelectric material may have a nanoscale size and a hexahedral shape. For example, the inorganic piezoelectric material may have a hexahedral shape having an edge size in a length in a range of about 100 to 200 nm. Also the inorganic piezoelectric material may have a perovskite structure.

For example, the inorganic piezoelectric material may include one or more among zinc-tin oxide ($ZnSnO_3$), barium titanate ($BaTiO_3$), and bismuth ferrite ($BiFeO_3$). When the inorganic piezoelectric material is the zinc-tin oxide ($ZnSnO_3$), the inorganic piezoelectric material may be formed by mixing a zinc sulfate heptahydrate ($ZnSO_4$ $7H_2O$) solution with a sodium stannate ($Na_2SnO_3$) solution, and a zinc-tin oxide deriving reaction at a predetermined temperature. A reaction temperature of the zinc sulfate heptahydrate and sodium stannate greatly affects a shape of the generated zinc-tin oxide. The above will be explained with reference to FIG. 3.

For example, the organic complex may include one or more among polydimethylsiloxane (PDMS) and polymethylmethacrylate (PMMA).

In the piezoelectric layer 30, the inorganic piezoelectric material may be mixed at about 35 to 45 wt % with respect to an overall weight of the complex. For example, the inorganic piezoelectric material may be mixed at about 40 wt % with respect to the overall weight of the complex. When a content of the inorganic piezoelectric material is less than 35 wt %, an amount of absorbed strain on the organic complex is great, and thus, an output value of the hybrid power generating device 100 may be decreased, and when a content of the inorganic piezoelectric material is greater than 45 wt %, an electric insulation of the complex is broken, and thus, an output value of the hybrid power generating device 100 may be decreased.

Further, a content of the inorganic piezoelectric material with respect to the overall weight of the complex may be adjusted, and may be properly adjusted based on an environment of the hybrid power generating device 100 according to the embodiment of the present invention.

The spacer 40 may be disposed on the piezoelectric layer 30. The spacer 40 may separate the piezoelectric layer 30 from the upper electrode layer 50 by a predetermined distance. Thus, the piezoelectric layer 30 and the upper electrode layer 50 may be rubbed against each other. Also, when a rubbing electrified body is included, the spacer 40 may separate the piezoelectric layer 30 from the rubbing electrified body by a predetermined distance.

The spacer 40 may be formed of a non-conductive material so as that the piezoelectric layer 30 and the upper electrode layer 50 are charged by rubbing against each other. Also, the spacer 40 may be formed of a non-conductive material so as that the piezoelectric layer 30 and the rubbing electrified body may be charged by rubbing against each other.

For example, aluminum (Al) may be used for the upper electrode layer 50, but materials of the upper electrode layer 50 and the piezoelectric layer 30 may be changed when the upper electrode layer 50 is rubbed against the piezoelectric layer 30 to generate static electricity. Also, the piezoelectric layer 30 and the upper electrode layer 50 may be preferably formed of a material which may generate a maximum static electricity by rubbing thereagainst. Thus, generated electric energy is greatly increased.

When the rubbing electrified body is included, materials of the rubbing electrified body and the piezoelectric layer 30 may be changed when the rubbing electrified body and the piezoelectric layer 30 rub each other to generate static electricity. Also, the piezoelectric layer 30 and the rubbing electrified body may be preferably formed of a material which may generate a maximum static electricity by rubbing thereagainst. Thus, generated electric energy is greatly increased.

For example, since the spacer 40 may protrude from both ends of the piezoelectric layer 30 to support the upper electrode layer 50, the piezoelectric layer 30 and the upper electrode layer 50 may be spaced apart from each other, but is not limited thereto.

When the piezoelectric layer 30 and the upper electrode layer 50 are rubbed against each other, one of the piezoelectric layer 30 and the upper electrode layer 50 may be charged with a positive charge (+) and the other may be charged with a negative charge (−).

When the piezoelectric layer 30 and the upper electrode layer 50 are charged with different charges, a voltage difference is generated between the piezoelectric layer 30 and the upper electrode layer 50, and an electric energy may be generated by the above voltage difference.

For example, when the piezoelectric layer 30 is charged with the negative charge (−) and the upper electrode layer 50 is charged with the positive charge (+), and the piezoelectric layer 30 is electrically connected to the upper electrode layer 50, the negative charge of the piezoelectric layer 30 flows to the upper electrode layer 50, and thus, a current flows from the upper electrode layer 50 toward the piezoelectric layer 30. By the above-principle, the hybrid power generating device 100 may generate the electric energy.

The above principle may be applied between the rubbing electrified body and the piezoelectric layer 30. When the rubbing electrified body is electrified with a different charge from the piezoelectric layer 30 by rubbing of the rubbing electrified body against the piezoelectric layer 30, charge transport is possible between the piezoelectric layer 30 and the rubbing electrified body through the upper electrode layer 50.

The upper electrode layer 50 may be disposed on the spacer 40, and formed of a conductive material. Also, the upper electrode layer 50 may be rubbed against the piezoelectric layer 30.

For example, aluminum (Al) may be used for the upper electrode layer 50, but materials of the upper electrode layer 50 and the piezoelectric layer 30 may be changed when the upper electrode layer 50 and the piezoelectric layer 30 are rubbed against each other to generate static electricity. Also, materials of the piezoelectric layer 30 and the upper electrode layer 50 may be selected to increase a maximum static electricity by rubbing against each other. Thus, the generated electric energy may be great.

Also, in order to rub the piezoelectric layer 30 and the upper electrode layer 50 against each other, the piezoelectric layer 30 and the upper electrode layer 50 may be formed of a flexible material.

When the rubbing electrified body is included, the upper electrode layer 50 may be disposed on the rubbing electrified body, and formed of a conductive material. Also, in order to rub the piezoelectric layer 30 and the rubbing electrified body against each other, the piezoelectric layer 30 and the rubbing electrified body may be formed of a flexible material.

The second substrate 60 may be disposed on an upper electrode layer, and may be a flexible substrate. Also, the second substrate 60 may support the upper electrode layer 50 disposed under the second substrate 60. For example, polyethylene-phthalate (PET) may be used for the second substrate 60, but this is not limited thereto.

FIG. 2 is a graph illustrating output voltages of the hybrid power generating device according to the embodiment of the present invention.

Referring to FIG. 2, as a pressure is increased, an output voltage of a hybrid power generating device 100 displayed as Hybrid is greater than an output voltage of an electrostatic generating device displayed as Tribo and an output voltage of a piezoelectric generating device displayed as Piezo.

Thus, using the hybrid power generating device 100 according to the embodiment of the present invention in a high pressure environment is more efficient in generating an electric energy.

FIG. 3 shows images illustrating shapes of zinc-tin oxide particles formed based on a reaction temperature of zinc sulfate heptahydrate and sodium stannate.

Referring to FIG. 3, the zinc sulfate heptahydrate and sodium stannate were reacted to compose zinc-tin oxide at a room temperature (RT), at a temperature of 40, and at a temperature of 80, respectively.

The zinc-tin oxide composed at the room temperature (RT) was composed as a shape having a rounded corner, and the zinc-tin oxide composed at the temperature of 40 was composed as a more angular shape than the zinc-tin oxide composed at the room temperature (RT). The zinc-tin oxide composed at the temperature of 80 was composed as a shape having angled edges of a hexahedral shape.

That is, as the temperature of the reaction was increased, the zinc-tin oxide having the hexahedral shape was more easily composed, and the most perfect hexahedral shape was made at a temperature of 80 or more. Thus, the zinc-tin oxide is preferably composed at a temperature of 80 or more.

According to the present invention, since a complex formed by mixing an inorganic piezoelectric material and an organic polymer is used, high mechanical stability and reliability may be secured.

Further, a high electric energy may be continuously generated regardless of an amount of an applied pressure compared with a conventional piezoelectric generating device.

Furthermore, a hybrid is formed with the piezoelectric generating device which generates an electric energy using a pressure and an electrostatic generating device which generates an electric energy using a static energy, and thus, defects of the both devices are complemented and a synergistic effect may be generated.

The present invention has been explained with reference to the exemplary embodiments, however, it will be apparent to those skilled in the art that various modifications can be made to the above-described exemplary embodiments of the present invention without departing from the spirit or scope of the invention. Here, the essential technical scope of the present invention is disclosed in the appended claims, and it is intended that the present invention cover all such modifications provided they come within the scope of the claims and their equivalents.

What is claimed is:

1. A hybrid power generating device, comprising:
 a first substrate;
 a lower electrode layer disposed on the first substrate;
 a monolithic piezoelectric layer disposed on the lower electrode layer, and formed of a complex in which an inorganic piezoelectric material is randomly distributed in an organic polymer matrix;
 a spacer disposed on the piezoelectric layer;
 an upper electrode layer disposed on the spacer; and a second substrate disposed on the upper electrode layer,
wherein the inorganic piezoelectric material has a hexahedral shape, and
wherein when an external force is applied to the hybrid power generating device, the hybrid power generating device generates electrical energy using a piezoelectric effect of the piezoelectric layer and generates electrical energy using static electricity between the piezoelectric layer and the upper electrode layer caused by the upper electrode rubbing against the piezoelectric layer.

2. The hybrid power generating device of claim 1, wherein the lower electrode layer comprises at least one selected from the group consisting of gold (Au), silver (Ag), copper (Cu), graphene, a carbon nanotube, and indium tin oxide (ITO).

3. The hybrid power generating device of claim 1, wherein the inorganic piezoelectric material comprises at least one selected from the group consisting of zinc tin oxide (ZnSnO3), barium titanate (BaTiO3), and bismuth ferrite (BiFeO3).

4. The hybrid power generating device of claim 1, wherein the organic polymer comprises at least one selected from the group consisting of polydimethylsiloxane (PDMS) and polymethylmethacrylate (PMMA).

5. The hybrid power generating device of claim 1, wherein the first substrate and the second substrate include flexible substrates.

6. The hybrid power generating device of claim 1, further comprising an auxiliary layer interposed between the lower electrode layer and the piezoelectric layer, and formed of a conductive material.

7. The power generating device of claim 6, wherein the auxiliary layer is formed of chromium (Cr).

8. The hybrid power generating device of claim 1, wherein the piezoelectric layer comprises the inorganic piezoelectric material at a content of 35 to 45 wt %.

9. The hybrid power generating device of claim 1, wherein the upper electrode is formed of aluminum.

10. The hybrid power generating device of claim 1, wherein the second substrate is formed of polyethylenephthalate (PET).

* * * * *